United States Patent [19]

Goldberg et al.

[11] Patent Number: 4,907,234
[45] Date of Patent: Mar. 6, 1990

[54] MONOLITHIC LASER DIODE STRUCTURE FOR MICROWAVE GENERATION

[75] Inventors: Lew Goldberg, Fairfax, Va.; Joseph F. Weller, Ft. Washington, Md.

[73] Assignee: The United States of America as represented by the Secretary of the Navy, Washington, D.C.

[21] Appl. No.: 347,132

[22] Filed: May 4, 1989

[51] Int. Cl.[4] .......................... H01S 3/098; H01S 3/19
[52] U.S. Cl. ........................................ 372/18; 372/50; 372/44; 372/32
[58] Field of Search .................... 372/18, 50, 44, 97, 372/23, 22, 108

[56] References Cited

U.S. PATENT DOCUMENTS

| | | | |
|---|---|---|---|
| 4,190,809 | 2/1980 | Goodman et al. | 372/44 |
| 4,393,503 | 7/1983 | Angelbeck et al. | 372/18 |
| 4,635,246 | 1/1987 | Taylor et al. | 372/18 |
| 4,686,485 | 8/1987 | Goldberg et al. | 330/4.3 |
| 4,730,325 | 3/1988 | Chow | 372/44 |
| 4,751,705 | 6/1983 | Hadley et al. | 372/50 |
| 4,831,630 | 5/1989 | Scifres et al. | 372/50 |

OTHER PUBLICATIONS

Publication, Phase-Locked (GaAl) As Laser Emitting 1.5W cw Per Mirror, by D. R. Scifres et al., Appl. Phys. Lett. 42(8) (15 Apr. 1983).
Publication, Microwave Signal Generation with Injection-Locked Laser Diodes, by L. Goldberg, Electronics Lett., vol. 19, No. 13, pp. 491-493 (23 Jun. 1983).
Sheffied et al., "An Independently Controllable Multiline Laser Resonator and its Use in Multi-Frequency Injection Locking", Appl. Phys. Lett., vol. 29, No. 9, Nov. 1, 1976, pp. 588-590.
Wang, "Master and Slave Oscillator Array System for Very Large Multiline Lasers", Applied Optics, vol. 17, No. 1, Jan. 1, 1978, pp. 83-86.
Kobayashi et al., "Injection Locking Characteristics of an AlGaAs Semiconductor Laser", IEEE Journal of Quantum Electronics, vol. QE-16, No. 9, Sep. 1980, pp. 915-917.

Primary Examiner—William L. Sikes
Assistant Examiner—Georgia Y. Epps
Attorney, Agent, or Firm—Thomas E. McDonnell; George Jameson

[57] ABSTRACT

A semiconductor laser structure for generating high frequency modulation of light intensity is disclosed. The apparatus comprises a seminconductor substrate, a semiconductor master laser and first and second semiconductor slave lasers fabricated adjacent to each other on the semiconductor substrate. Bias current applied to the master oscillator is modulated at a preselected frequency to cause the master laser to generate a plurality of optical frequency modulation sidebands. The first and second slave lasers, which are tuned to be close to the preselected first and second sidebands of the master laser, are injection-locked to the first and second preselected sidebands of the master laser.

11 Claims, 3 Drawing Sheets

MONOLITHIC LASER DIODE STRUCTURE FOR MICROWAVE GENERATION

BACKGROUND OF THE INVENTION

1. Field of the Invention

The present invention relates to semiconductor lasers, or stripe lasers, and particularly to a semiconductor laser diode structure for generating high frequency modulation of light intensity.

2. Description of the Prior Art

One standard technique for intensity modulating light at high frequencies is by directly modulating laser bias current, as disclosed in the published article of J.E. Bowers et al., "High-frequency constricted mesa lasers", Appl. Phys. Lett., V. 47, pp. 78–80 (15 July 1985). Another standard technique for intensity modulating light at high frequencies is by using an external electrooptic modulator, as disclosed in the published article of T. Sueta et al., "High Speed Guided-Wave Optical Modulators", J. Opt. Communications, V.3, pp. 52–58 (1982). However, these standard techniques are limited to frequencies of less than 30 gigahertz (GHz).

An alternative technique to the two above-described techniques involves the injection-locking of two discrete semiconductor lasers to the frequency modulation (FM) sidebands of a discrete master laser. Such an alternative technique will now be discussed by referring to the prior art system of FIG. 1 and the waveforms of FIG. 2.

The system of FIG. 1 relies on the principle that when the bias current (not shown) of a semiconductor master laser (ML) 11 is modulated sinusoidally at a modulating frequency $f_m$, the emission or optical spectrum 12 of the master laser 11 splits up into several discrete lines or FM sidebands. These sidebands are separated by the modulation frequency $f_m$ and extend several tens of gigahertz on each side of the optical laser emission frequency or carrier frequency signal CF. Illustrated in FIG. 2 are exemplary optical sidebands $N-1$, $N-2$ and $N-3$ to the left of the carrier frequency signal CF and sidebands $N+1$, $N+2$ and $N+3$ to the right of the carrier frequency signal CF. More particularly, sideband $N-3$ is the third sideband left of (or below) the carrier frequency signal CF, while sideband $N+3$ is the third sideband on the right of (or above) the carrier frequency signal CF.

The FM modulated emission of the master laser 11 is transmitted to a beam splitter 13, which splits the emitted light into two beams. One beam passes through the beam splitter 13 to a semiconductor slave laser (SL) 15, while the other beam is reflected from the beam splitter 13 to another semiconductor slave laser 17. Thus, the FM modulated emission of the master laser 11 is injected or coupled by way of the beam splitter 13 into the semiconductor slave lasers 15 and 17. The emission frequencies of the slave lasers 15 and 17 are adjusted or tuned so that they approximately coincide with the exemplary sidebands $N-3$ and $N+3$, respectively, of master laser 11.

The frequency adjustment or tuning of the slave lasers 15 and 17 can be accomplished by changing the temperatures and/or bias currents of the slave lasers 15 and 17. After the frequency adjustments of the slave lasers 15 and 17 are carried out, light injected from the master laser 11 into each of the slave lasers 15 and 17 causes the slave lasers 15 and 17 to be injection-locked to the $N-3$ and $N+3$ sidebands of the master laser 11. These $N-3$ and $N+3$ sidebands are respectively designated in FIG. 2 as SL 15 and SL 17 frequencies.

Since light is injected from the master laser 11 into each of the slave lasers 15 and 17, the slave lasers 15 and 17 act as narrow band amplifiers for the particular sidebands that respectively coincide with their free-running frequencies. As a result, slave laser (SL) 15 amplifies the $N-3$ sideband and slave laser (SL) 17 amplifies the $N+3$ sideband of the master laser 11. The amplification bandwidth of each of the slave lasers 15 and 17 is narrow. Consequently, each of the slave lasers 15 and 17 only amplifies the particular sideband that its free-running frequency coincides with and is not affected by all of the other sidebands in the spectrum of the master laser 11 shown in FIG. 2.

This process of amplification is sometimes referred to as injection-locking. More specifically, injection-locking of slave laser 15 occurs when the optical emission of slave laser 15 takes on the same frequency and phase as the light from the injected sideband $N-3$ of master laser 11. In a similar manner, injection-locking of slave laser 17 occurs when the optical emission of slave laser 17 takes on the same frequency and phase as the light from the injected sideband $N+3$ of master laser 11. As a consequence of the slave lasers 15 and 17 being injection-locked by the respective sidebands $N-3$ and $N+3$ of the same master laser 11, the output light beams from those slave lasers will be phase coherent with each other.

The output light beams from the slave lasers 15 and 17 are then combined in a beamsplitter 19 to produce an optical beat frequency or intensity modulation frequency. To produce this optical beat frequency, the output beam from slave laser 15 is directly applied to the beamsplitter 19, while the output of slave laser 17 is sequentially reflected from mirrors 21 and 23 before being applied to the beamsplitter 19.

In response to the two beams from the slave lasers 15 and 17, the beamsplitter 19 produces a combined beam which contains an optical beat frequency which is equal to the optical frequency separation of the two slave lasers 15 and 17. This optical frequency separation is equal to the frequency separation of the sidebands $N-3$ and $N+3$ of the master laser 11.

It should be noted at this time that a fiber coupler (not shown) could be substituted for the beamsplitter 19 to produce the optical beat frequency between the two light beams from the slave lasers 15 and 17.

The combined beam of slave laser beams at the output of the beamsplitter 19 is photodetected by a photodiode 25 to develop microwave current signals. This photodiode 25 functions as a mixer to generate a difference frequency which is equal to the optical difference frequency between the frequencies of the two slave lasers 15 and 17.

A sum frequency is not generated at the output of the photodiode 25 because it is at a much higher frequency which is beyond the frequency response range of the photodiode 25. In addition, because of the phase coherence of the output light beams of the two slave lasers 15 and 17, which is a consequence of their being injection-locked by the sidebands of the master laser 11, the spectral width of the beat signal is very narrow.

OBJECTS OF THE INVENTION

Accordingly, one object of the invention is to provide a system, which includes a novel monolithic laser diode structure, for microwave generation.

Another object of the invention is to provide a novel, monolithic implementation for FM sideband injection-locking.

Another object of the invention is to provide a semiconductor laser diode structure for generating high frequency modulation of light intensity.

A further object of the invention is to provide a novel semiconductor laser diode structure for FM sideband injection-locking, which structure is much smaller in size and bulk and possesses greater environmental stability than known prior art techniques for FM sideband injection-locking.

SUMMARY OF THE INVENTION

These and other objects are achieved in the present invention by providing an apparatus which comprises a semiconductor substrate, a semiconductor master laser and first and second semiconductor slave lasers fabricated adjacent to each other on the semiconductor substrate. Bias current applied to the master oscillator is modulated at a preselected frequency to cause the master laser to generate a plurality of optical frequency modulation sidebands. The first and second slave lasers, which are tuned to be close to the preselected first and second sidebands of the master laser, are injection-locked to the first and second preselected sidebands of the master laser.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views, and wherein.

DETAILED DESCRIPTION OF THE PREFERRED EMBODIMENT

Figure 1:
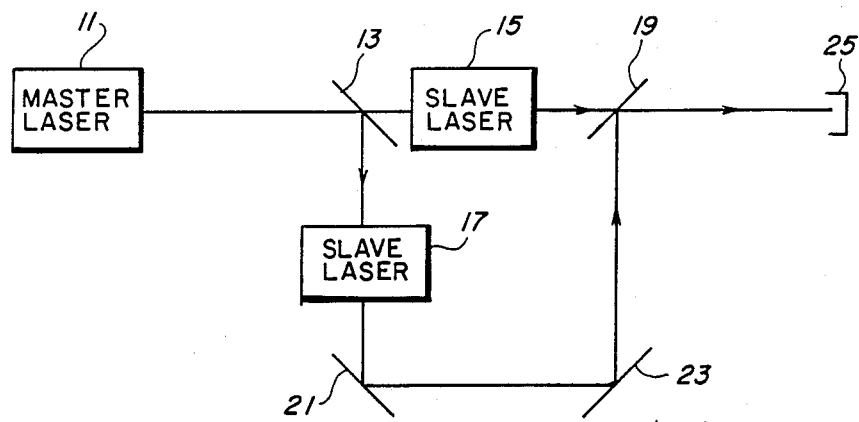
FIG. 1 illustrates a prior art system for injection-locking two semiconductor lasers to the frequency modulation sidebands of a master laser and to further generate a microwave signal.
Figure 3:
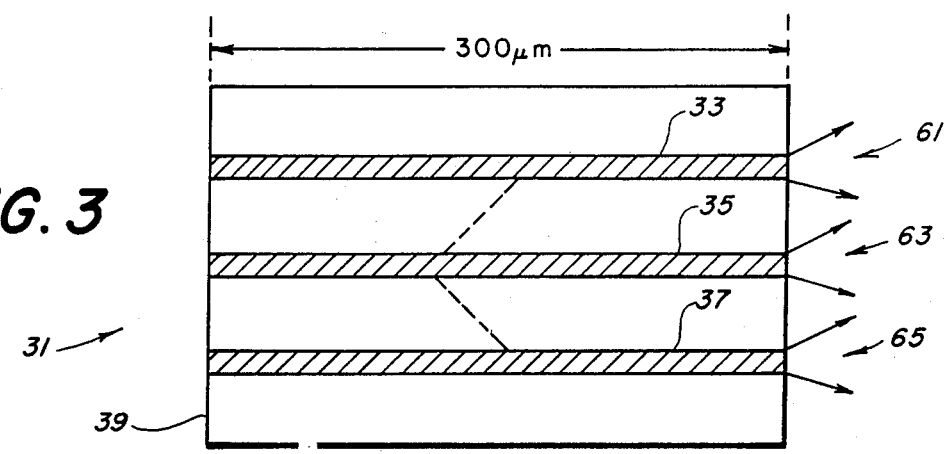
FIG. 3 illustrates a top view of a novel, monolithic implementation for FM sideband injection-locking in accordance with a preferred embodiment of the invention.
Figure 4:
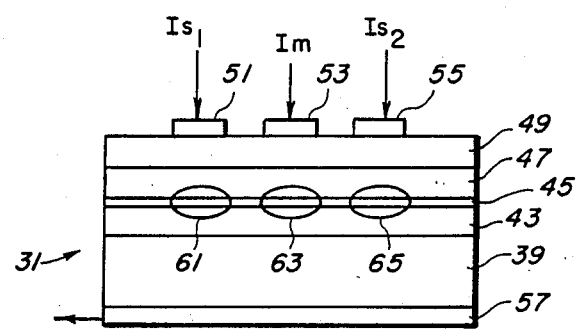
FIG. 4 illustrates an end view of the structure shown in FIG. 3.

Referring now to FIGS. 3 and 4, a preferred embodiment of the invention is shown. More specifically, FIG. 3 and 4 respectively show top and end views of a novel, monolithic implementation of the prior art system of FIG. 1 for FM sideband injection-locking. In other words, instead of using several individual or discrete lasers (such as the lasers 11, 15 and 17 in FIG. 1) the invention uses a single set of semiconductor lasers manufactured on the same semiconductor chip or substrate to perform the same purpose of FM sideband injection-locking.

FIG. 3 shows a semiconductor laser structure or apparatus 31 comprised of three stripe lasers or laser diodes 33, 35 and 37 fabricated adjacent to each other on the same semiconductor chip or substrate 39. The two outside stripe lasers 33 and 37 are the slave lasers of the center stripe laser 35, which is the master laser.

As shown in FIG. 4, the semiconductor laser structure 31 includes the semiconductor substrate 39 upon which a set of semiconductor layers 43, 45, 47 and 49 are, for example, epitaxially grown. Layer 45 is an active semiconductor layer which is sandwiched between two passive semiconductor layers 43 and 47 of higher band-gap, lower refractive index material to provide optical and carrier confinement in a direction normal to the plane of the layers. The layers 43 and 47 are of opposite conductivity type. Metal contacts or electrodes 51, 53 and 55 are deposited through a mask (not shown) onto the layer 49 at respective positions on the layer 49 over the stripe lasers 33, 35 and 37. A metallic layer or common electrode 57 is also deposited onto the bottom of the substrate 39. The layer 49 is highly doped to improve the electrical conductivity between each of the electrodes 51, 53 and 55 and the common electrode 57. For ease of viewing the stripe lasers 33, 35 and 37 in FIG. 3, the metal electrodes 51, 53 and 55 (shown in FIG. 4) are not shown in FIG. 3.

It should be noted at this time that while the semiconductor lasers 33, 35 and 37 have been generally discussed and illustrated in FIGS. 3 and 4, stripe lasers are well known in the art. As a result, the semiconductor lasers 33, 35 and 37 could be fabricated according to the teachings of any one of a variety of heterostructural semiconductor lasers known in the art. For a detailed review of semiconductor lasers see "Semiconductor Lasers and Heterojunction LED's" by Kressel and Butler, Academic Press (1977). The material in this book is incorporated by reference into the present application.

In operation, the lasers 33, 35 and 37 are controlled individually by their associated bias or injected currents $Is_1$, $Im$ and $Is_2$ (FIG. 4). The injected currents $Is_1$, $Im$ and $Is_2$ respectively flow from current sources (not shown) through the respective electrodes 51, 53 and 55, through the layers 49, 47, 45, 43 and 39 of the laser structure 31 to the common electrode 57 and then back to their respective current sources. The electrodes 51, 53 and 55 confine these currents $Is_1$, $Im$ and $Is_2$ to very narrow regions under these electrodes.

When the injected currents $Is_1$, $Im$ and $Is_2$ flow through the active layer 45, laser emission or light beams 61, 63 and 65 are emitted by the active layer 45. Each of these emitted light beams 61, 63 and 65 is confined within the boundaries of the associated portion of the passive semiconductor layers 43 and 47 (which operate as waveguiding layers) that is under the associated one of the electrodes 51, 53 and 55. Thus, each of the three light beams 61, 63 and 65 is transmitted out of the laser structure 31 in a direction perpendicular to the direction of the associated one of the injected currents $Is_1$, $Im$ and $Is_2$.

Laser emission in the laser structure 31 takes place in very narrow regions. Typically, each of these regions, designated by the light beams 61, 63 and 65 in FIG. 4, covers an approximate area of five micrometers by one micrometer in size.

Figure 2:
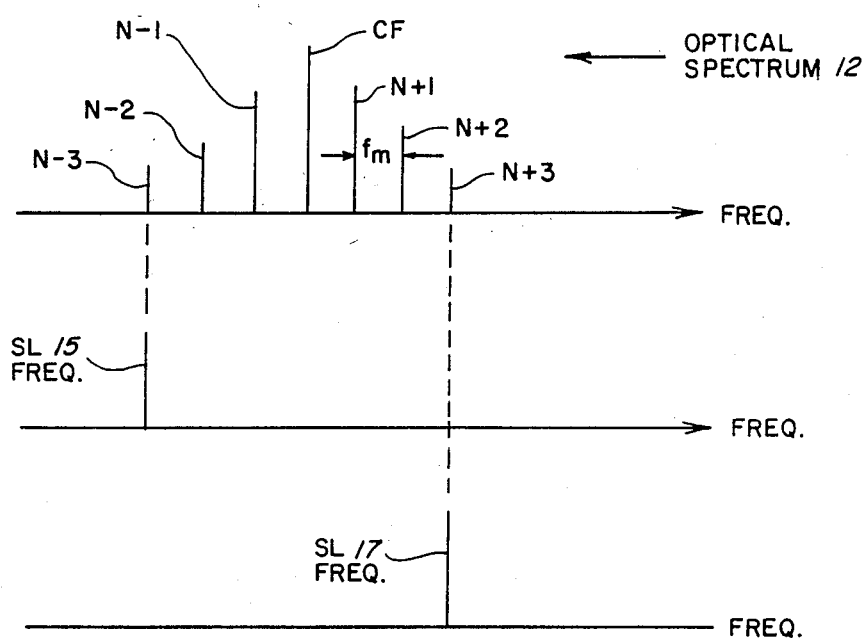
FIG. 2 illustrates optical spectra useful in understanding the operations of the prior art system of FIG. 1 and the invention shown in FIG. 3.

The optical emission frequencies of the stripe lasers 33, 35 and 37 can be adjusted or tuned by changing the amplitudes of the bias or injected currents $Is_1$, $Im$ and $Is_2$ to preselected amplitudes, as discussed before. In this manner, the emission frequency of the master stripe laser 35 can be tuned to, for example, the carrier frequency signal CF (FIG. 2). Thus, when the preselected bias $Im$ is sinusoidally modulated with a microwave signal at, for example, a frequency $f_m$, its emission spectrum is split up into, for example, the FM sidebands shown in FIG. 2. Then the bias or injected currents $Is_1$ and $Is_2$ are adjusted to preselected amplitudes to respectively tune the emission frequencies of the stripe lasers 33 and 37 to be approximately equal to for example, the FM sidebands $N-3$ and $N+3$ of the master laser optical spectrum 12 shown in FIG. 2.

In order to obtain injection-locking of the stripe slave lasers 33 and 37 to the exemplary $N-3$ and $N+3$ FM sidebands of the stripe master laser 35, optical coupling is allowed to take place between the stripe master laser 35 and the stripe slave lasers 33 and 37. This optical coupling takes place because of the closeness of the spacing between the stripe master laser 35 and each of the stripe slave lasers 33 and 37. The closeness of this spacing enables a small amount of light to couple from the master laser 35 to each one of the slave lasers 33 and 37 to injection-lock those slave lasers to the respective exemplary $N-3$ and $N+3$ sidebands of the master laser 35. This optical coupling process is known as evanescent field coupling and has been previously used in coupled-stripe laser arrays, as disclosed in the published article of D. R. Scifres et al., "Phase-locked (GaAl)As laser emitting 1.5W cw per mirror", Appl. Phys. Lett. 42(8), pp. 645–647 (15 Apr. 1983).

It should however be realized that the slave lasers 33 and 37 can be injection locked to any FM sidebands of the master laser 35 by the proper selection of the bias currents for those slave lasers.

Figure 5:
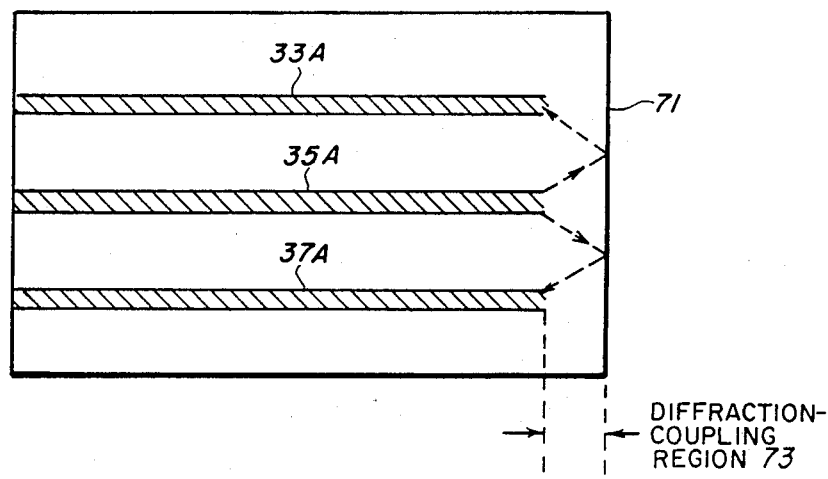
FIG. 5 illustrates a top view of a modification of the embodiment of FIG. 3.

A modification of the embodiment of FIG. 3 is shown in FIG. 5. The only difference between the embodiment of FIG. 3 and its modification in FIG. 5 is that the coupling mechanism or injection-locking between the stripe lasers 33A, 35A and 37A of FIG. 5 is different than the evanescent coupling shown in FIG. 3. In FIG. 5, the stripe lasers 33A, 35A and 37A (which respectively correspond in structure to the stripe lasers 33, 35 and 37 of FIG. 3) are separated sufficiently far apart so that there is no significant evanescent field coupling between the stripe master laser 35A and each of the stripe slave lasers 33A and 37A. Instead, "diffraction coupling" is used in the modification of FIG. 5 to injection-lock the slave lasers 33A and 37A to preselected sidebands of the master laser 35A.

Diffraction coupling is obtained by terminating the lengths of the lateral waveguides (which are formed by the passive or waveguiding layers 43 and 47 of FIG. 4) of the lasers 33A, 35A and 37A at some preselected distance away from one of the laser facets or edges 71 of the laser structure 31. That portion of the laser 18 structure 31 between the ends of the lasers 33A, 35A and 37A and the laser facet 71 is called a diffraction-coupling region 73. As shown in FIG. 5, there is no built-in lateral optical confinement or waveguide in the region 73. Without lateral confinement, the light or light beam emerging from the master laser 35A (or its waveguide) undergoes diffraction, or begins to widen, when it enters the diffraction-coupling region 73. This diffracted beam is incident upon the laser facet 71 and is reflected therefrom. Some of this reflected light couples into the slave lasers 33A and 37A on either side of the master laser 35A and injection-locks those slave lasers to the preselected sidebands of the master laser 35A that the slave lasers were respectively tuned to. This optical diffraction coupling scheme between adjacent lasers on a single substrate has been previously used to fabricate laser arrays, as disclosed in the published article of J. Katz et al., "Diffraction coupled phase-locked semiconductor laser array", Appl. Phys. Lett. 42(7), pp. 554–556 (1 Apr. 1983).

Figure 6:
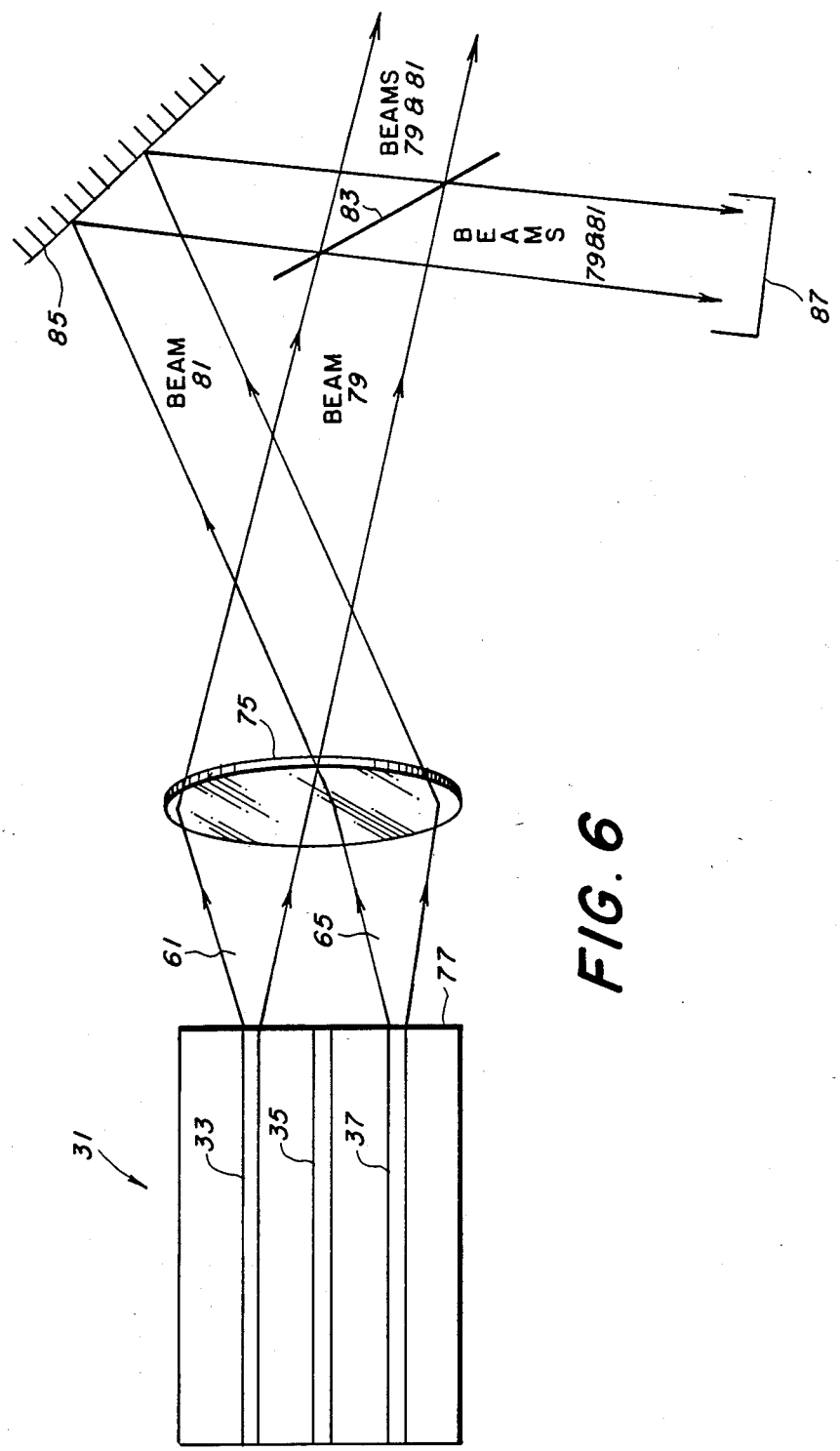
FIG. 6 illustrates a system, which includes the monolithic laser diode structure of FIG. 3, for generating a microwave current.

Referring now to FIG. 6, a system which includes the monolithic laser diode structure 31 of FIGS. 3 and 4 is shown for generating a microwave current. However, it should be realized that the modification shown in FIG. 5 could also be used in place of the laser structure 31 of FIG. 3 to form the system of FIG. 6. Basically, the system of FIG. 6 operates to injection-lock the slave lasers 33 and 37 to different sidebands of the master laser 35 (as discussed above) and then to generate narrowband microwave beat signals by combining the outputs of the slave lasers 33 and 37 using external optics and then detecting the combined beams with a photodiode.

More specifically, light from the structure 31 is collected by a spherical lens 75 which is displaced from the laser facet 77 of the structure 31 by a distance equal to the focal length of the lens 75. As a result, the light beams 61 and 65 (which are respectively emitted by the outer slave lasers 33 and 37) are collimated by the lens 75 and propagate as collimated beams 79 and 81 in different direction, as shown in FIG. 6.

Lens 75 transmits the collimated beam 79 directly to a beam splitter 83 and directs the collimated beam 81 to a mirror 85 which reflects the beam 81 to the beam splitter 83. The beam splitter 83 passes part of the beam 81 therethrough and reflects part of the beam 79. Thus, the beams 79 and 81 are combined into a composite beam by the beam splitter 83. This composite beam is incident upon a photodiode 87 to produce a microwave photocurrent which has a frequency equal to the optical difference frequency between the frequencies of the two slave lasers 33 and 37.

The present invention can be used in the generation of microwave signals, in the optical control of a phased array radar, in optical fiber microwave delay lines and in optical fiber communications.

Typical microwave frequencies which could be generated by this invention are in the 10 to 100 gigahertz (GHz) range. The maximum frequency is limited by the frequency response bandwidth of the photodiode 87 (FIG. 6), which has been demonstrated to work to about 100 GHz.

Therefore, what has been described is a novel monolithic laser diode structure for generating high frequency modulation of light intensity, and a microwave generating system which includes such a novel monolithic laser diode structure.

It should therefore readily be understood that many modifications and variations of the present invention are possible within the purview of the claimed invention. For example, a simplified version of the injection-locking embodiment discussed in FIGS. 3, 4 and 5 would use only a single slave laser, injection-locked to a sideband of the master laser. In addition, microwave modulated light can be generated by beating the master laser carrier signal with the output of a slave laser which is injection-locked to one of the master laser FM sidebands. It is therefore to be understood that, within the scope of the appended claims, the invention may be practiced otherwise than as specifically described.

What is claimed and desired to be secured by letters patent of the United States is:

1. An apparatus comprising:
   a semiconductor substrate;
   a semiconductor master laser and first and second semiconductor slave lasers fabricated adjacent to each other on said semiconductor substrate, said master laser generating an optical output at a frequency $f_o$ and sidebands at multiples of $\Delta f$, said first and second slave lasers being tuned to approximately coincide with first and second preselected sidebands of said master laser; and
   means for respectively injection-locking said first and second slave lasers to said first and second preselected sidebands.

2. The apparatus of claim 1 wherein:
   said injection-locking means is created by a predetermined close spacing between said master laser and each of said first and second slave lasers on said semiconductor substrate, which close spacing enables a small amount of light to couple from said master laser to each of said first and second slave lasers to injection-lock said first and second slave lasers to said first and second preselected sidebands, respectively.

3. The apparatus of claim 1 wherein:
   said master laser and said first and second slave lasers are fabricated to only extend to a region near a first edge of said semiconductor substrate, whereby light emerging from said master laser defracts and reflects from the first edge of said semiconductor substrate back into said first and second slave lasers to injection-lock said first and second slave lasers to said first and second preselected sidebands, respectively.

4. The apparatus of claim 1 further including:
   means responsive to said injection-locked outputs of said first and second slave lasers for generating a microwave signal.

5. The apparatus of claim 4 wherein said generating means comprises:
   optical means for combining said injection-locked outputs of said first and second slave lasers into a combined optical beam; and
   photodetection means responsive to said combined beam for developing said microwave signal.

6. The apparatus of claim 5 wherein said optical means comprises:
   a lens for selectively collimating light from said first and second slave lasers to respectively produce first and second collimated beams;
   means for reflecting said first collimated beam toward said photodetection means;
   a beamsplitter interposed between said reflecting means and said photodetection means for combining said reflected first collimated beam with said second collimated beam to form said combined optical beam.

7. The apparatus of claim 6 wherein:
   said reflecting means is a mirror.

8. An apparatus comprising:
   a semiconductor substrate;
   a semiconductor master laser and semiconductor first and second slave lasers fabricated adjacent to each other on said semiconductor substrate;
   means for supplying to said semiconductor master laser a bias current modulated at a preselected frequency to cause said master laser to generate a plurality of optical frequency modulation sidebands;
   means for selectively adjusting the optical frequencies of said semiconductor first and second slave lasers to be close to preselected first and second sidebands of said master laser; and
   means for injection-locking said first and second slave lasers to said first and second preselected sidebands, respectively.

9. The apparatus of claim 8 wherein said means for selectively adjusting comprises:
   means for respectively applying first and second bias currents to said first and second slave lasers to cause their emission frequencies to be close to said first and second sidebands.

10. The apparatus of claim 8 further including:
    means responsive to said injection-locked outputs of said first and second slave lasers for developing narrowband microwave beat signals.

11. The apparatus of claim 10 wherein said developing means comprises:
    optical means for combining said injection-locked outputs of said first and second slave lasers into a combined optical beam; and
    photodetection means responsive to said combined beam for developing said narrowband microwave beat signals.

* * * * *